(12) United States Patent
Ho et al.

(10) Patent No.: US 9,997,473 B2
(45) Date of Patent: Jun. 12, 2018

(54) CHIP PACKAGE AND METHOD FOR FORMING THE SAME

(71) Applicant: XINTEC INC., Taoyuan (TW)

(72) Inventors: Yen-Shih Ho, Kaohsiung (TW);
Tsang-Yu Liu, Zhubei (TW);
Chia-Sheng Lin, Taoyuan (TW);
Chaung-Lin Lai, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days. days.

(21) Appl. No.: 15/409,289

(22) Filed: Jan. 18, 2017

(65) Prior Publication Data

US 2017/0207182 A1 Jul. 20, 2017

Related U.S. Application Data

(60) Provisional application No. 62/280,620, filed on Jan. 19, 2016.

(51) Int. Cl.
| | |
|---|---|
| *H01L 23/00* | (2006.01) |
| *H01L 21/78* | (2006.01) |
| *H01L 21/52* | (2006.01) |
| *H01L 21/54* | (2006.01) |
| *H01L 23/18* | (2006.01) |
| *H01L 23/055* | (2006.01) |
| *H01L 21/48* | (2006.01) |

(52) U.S. Cl.
CPC ........ *H01L 23/562* (2013.01); *H01L 21/4817* (2013.01); *H01L 21/52* (2013.01); *H01L 21/54* (2013.01); *H01L 21/78* (2013.01); *H01L 23/055* (2013.01); *H01L 23/18* (2013.01); *H01L 24/16* (2013.01); *H01L 2224/16237* (2013.01)

(58) Field of Classification Search
None
See application file for complete search history.

(56) References Cited

U.S. PATENT DOCUMENTS

| | | | | |
|---|---|---|---|---|
| 6,294,839 | B1 * | 9/2001 | Mess | H01L 22/26 257/686 |
| 6,600,231 | B2 * | 7/2003 | Tominaga | H01L 23/13 257/257 |
| 2011/0057273 | A1 * | 3/2011 | O'Donnell | B81C 1/0023 257/414 |
| 2012/0319297 | A1 * | 12/2012 | Yen | H01L 23/3128 257/774 |
| 2013/0307125 | A1 * | 11/2013 | Huang | H01L 23/3121 257/623 |

OTHER PUBLICATIONS

Vincent, M.B., et al. "Enhancement of Underfill Adhesion to Die and Substrate by Use of Silane Additives." Proceedings. 4th International Symposium on Advanced Packaging Materials Processes, Properties and Interfaces (Cat. No. 98EX153), doi:10.1109/isapm.1998.664432.*

* cited by examiner

*Primary Examiner* — Joseph Schoenholtz
(74) *Attorney, Agent, or Firm* — Liu & Liu

(57) ABSTRACT

A chip package including a substrate is provided. The substrate has a first surface and a second surface opposite thereto. The substrate includes a sensing or device region which is adjacent to the first surface. A recess is in the substrate. The recess extends from the second surface towards the first surface, and vertically overlaps the sensing or device region. A redistribution layer is electrically connected to the sensing or device region, and extends from the second surface into the recess. A method of forming the chip package is also provided.

23 Claims, 9 Drawing Sheets

CHIP PACKAGE AND METHOD FOR FORMING THE SAME

CROSS REFERENCE TO RELATED APPLICATIONS

This application claims the benefit of U.S. Provisional Application No. 62/280,620 filed on Jan. 19, 2016, the entirety of which is incorporated by reference herein.

BACKGROUND OF THE INVENTION

Field of the Invention

The invention relates to chip package technology, and in particular to a chip package and methods for forming the same.

Description of the Related Art

The chip packaging process is an important step in the fabrication of electronic products. Chip packages not only protect the chips therein from outer environmental contaminants but also provide electrical connection paths between the electronic elements inside and those outside of the chip packages.

In general, chip packages and other electronic elements (e.g., various integrated circuit chips, active elements, or passive elements) are individually disposed on a circuit board to form chip modules. Afterwards, the chip modules are mounted onto a motherboard, so as to fabricate an electronic product.

However, the size of the chip modules is limited by such a fabrication, such that it is difficult to further reduce the size of the formed electronic product.

Accordingly, there exists a need for a novel chip package and methods for forming the same capable of eliminating or mitigating the aforementioned problems.

BRIEF SUMMARY OF THE INVENTION

An embodiment of the invention provides a chip package which includes a substrate. The substrate has a first surface and a second surface opposite thereto. The substrate includes a sensing or device region which is adjacent to the first surface. The chip package also includes a recess in the substrate. The recess extends from the second surface towards the first surface and vertically overlaps the sensing or device region. The chip package also includes a redistribution layer electrically connected to the sensing or device region and extending from the second surface into the recess.

An embodiment of the invention provides a method for forming a chip package which includes providing a substrate. The substrate has a first surface and a second surface opposite thereto and includes a sensing or device region which is adjacent to the first surface. The method for forming a chip package also includes forming a recess in the substrate. The recess extends from the second surface towards the first surface and vertically overlaps the sensing or device region. The method for forming a chip package also includes forming a redistribution layer electrically connected to the sensing or device region and extending from the second surface into the recess.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Furthermore, when a first material layer is referred to as being on or overlying a second material layer, the first material layer may be in direct contact with the second material layer, or spaced apart from the second material layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by a stack of a plurality of wafers having integrated circuits.

Figure 1A:
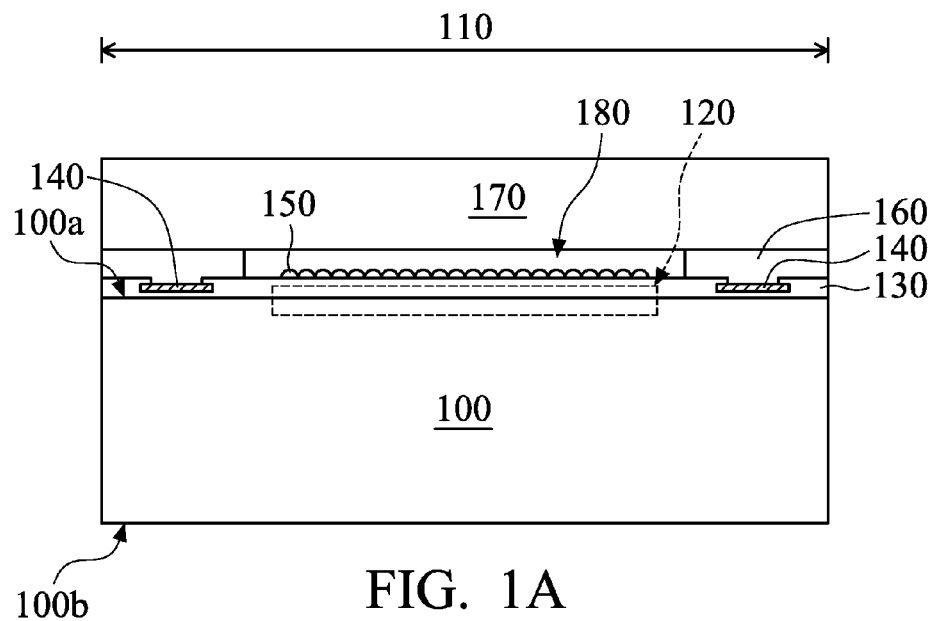
FIGS. 1A to 1G are cross-sectional views of an exemplary embodiment of a method for forming a chip package according to the invention.
Figure 1B:
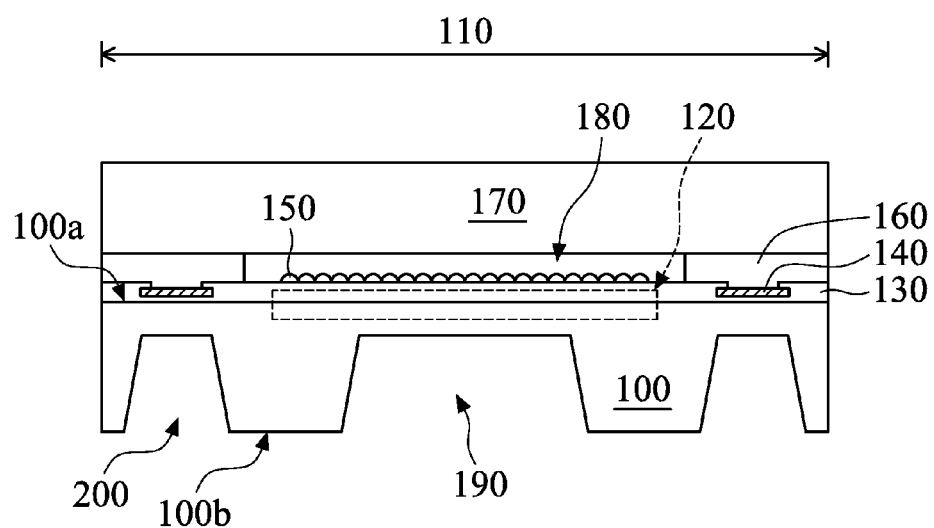
Figure 1C:
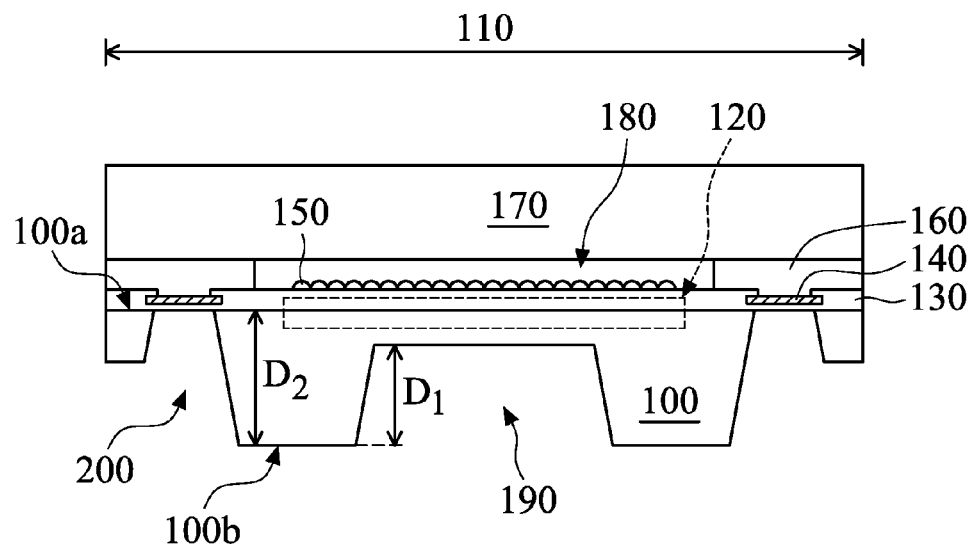
Figure 1D:
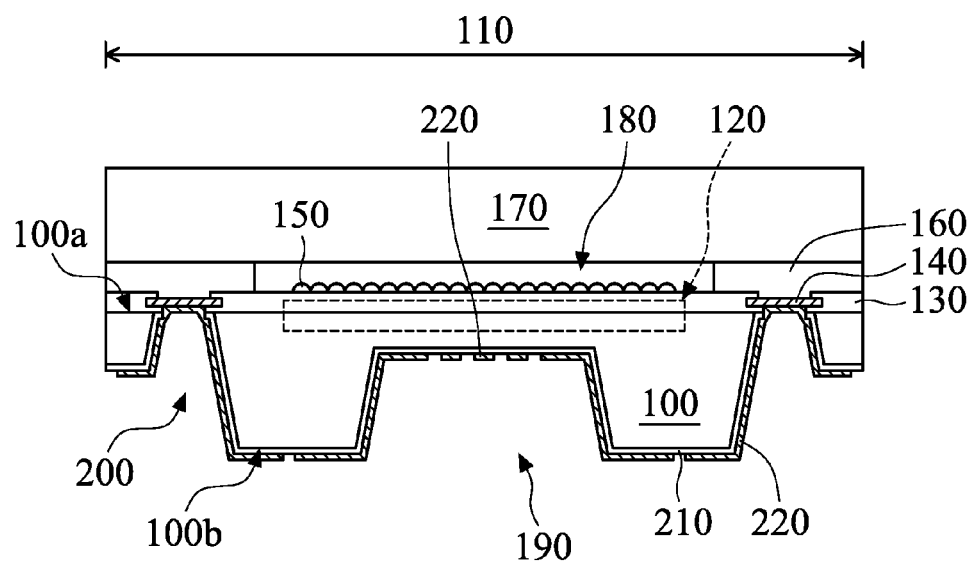
Figure 1E:
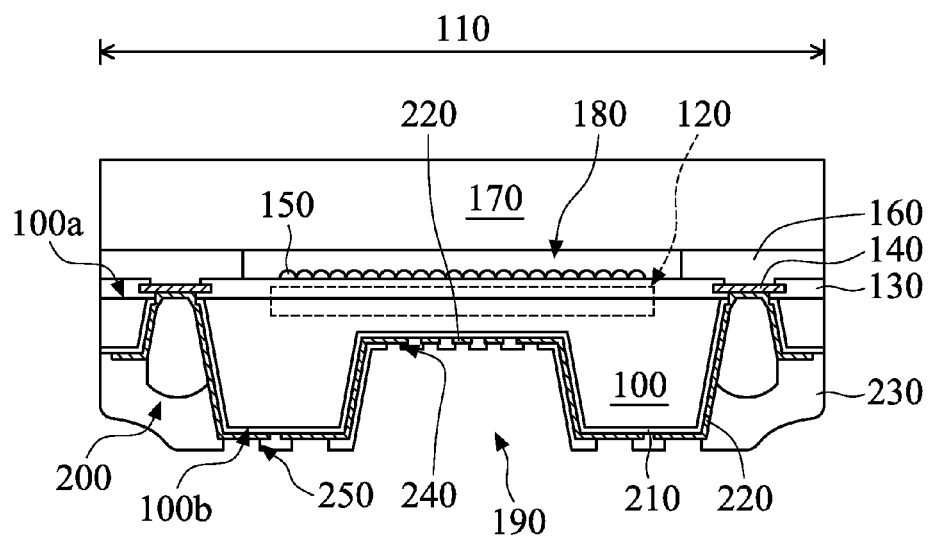
Figure 1F:
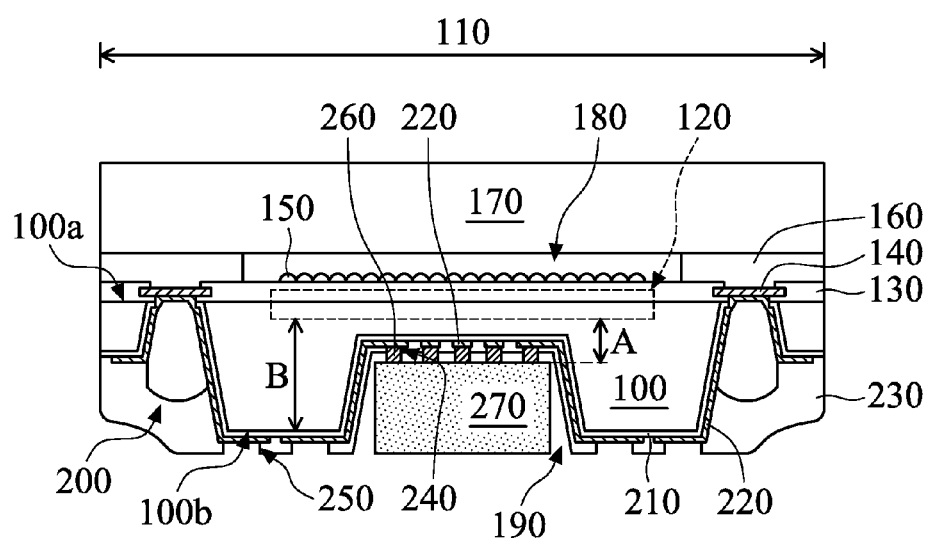
Figure 1G:
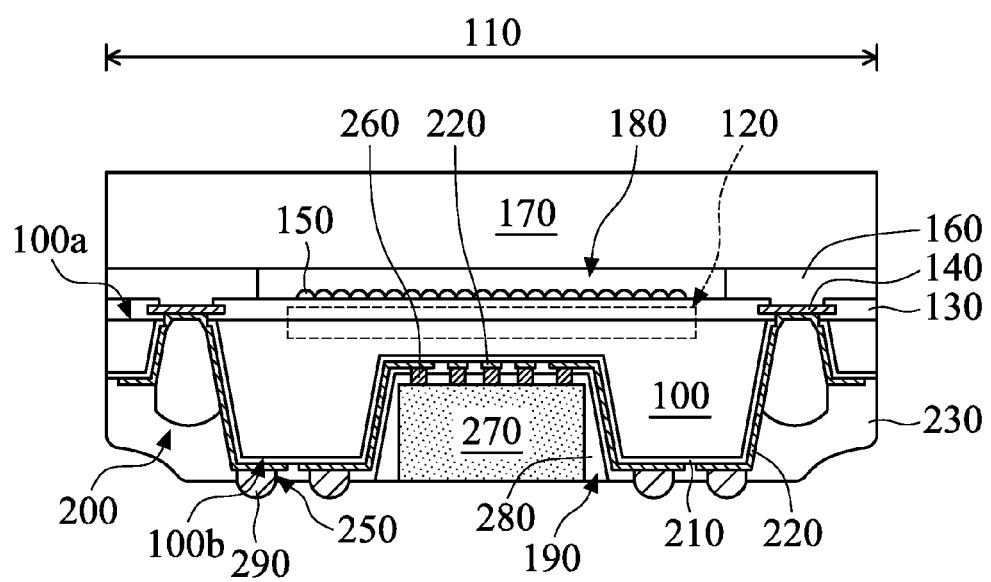
Figure 2:
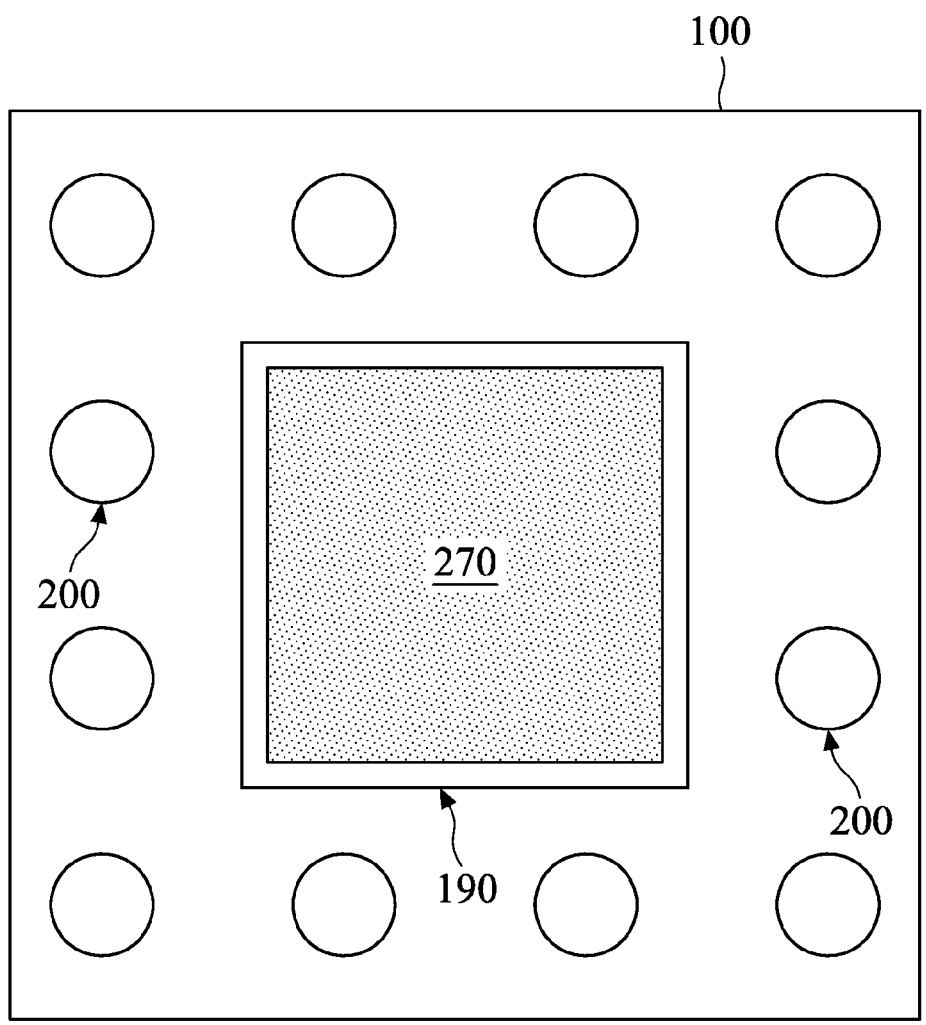
FIGS. 2 to 5 are plan views of various exemplary embodiments of a chip package according to the invention.

Refer to FIGS. 1G and 2, in which FIG. 1G illustrates a cross-sectional view of an exemplary embodiment of a chip package according to the invention, and FIG. 2 illustrates a plan view of an exemplary embodiment of a chip package according to the invention. To simplify the diagram, only some components of the chip package are depicted in FIG. 2. The chip package may include a chip/die comprised of a substrate 100 and an insulating layer 130. The substrate 100 has a first surface 100a and a second substrate 100b opposite thereto. In some embodiments, the substrate 100 may be a silicon substrate or another semiconductor substrate.

The insulating layer 130 is disposed on the first surface 100a of the substrate 100. In general, the insulating layer 130 may be formed of an interlayer dielectric (ILD) layer, an inter-metal dielectric (IMD) layer, and a passivation layer covering thereon. To simplify the diagram, only a single insulating layer 130 is depicted herein. In some embodiments, the insulating layer 130 may comprise an inorganic material, such as silicon oxide, silicon nitride, silicon oxynitride, metal oxide, or a combination thereof, or another suitable insulating material.

In some embodiments, the chip package includes a sensing or device region 120. The sensing or device region 120 may be adjacent to the first surface 100a and in the substrate 100 and/or the insulating layer 130. In some embodiments, the sensing or device region 120 may include a sensing device and/or an active device (e.g., a transistor) therein. In some embodiments, the sensing or device region 120 includes a light-sensing device or another suitable optoelectronic device. In other embodiments, the sensing or device region 120 may include a device that is configured to sense biometrics (e.g., a fingerprint recognition device), a device that is configured to sense environmental characteristics (e.g., a temperature-sensing element, a humidity-sensing element, a pressure-sensing element, a capacitance-sensing element), or another suitable sensing element.

In some embodiments, the insulating layer 130 on the first surface 100a of the substrate 100 includes one or more conductive pads 140 therein. The conductive pad 140 is adjacent to the first surface 100a and located outside of the sensing or device region 120. In some embodiments, the conductive pad 140 may be formed of a single conductive layer or multiple conductive layers. To simplify the diagram, only two conductive pads 140 comprising a single conductive layer in the insulating layer 130 are depicted herein as an example. In some embodiments, the insulating layer 130 has one or more openings therein to expose corresponding conductive pads 140. In some embodiments, the sensing or device region 120 is electrically connected to the conductive pad 140 via an interconnect structure (not shown) in the substrate 100 and/or the insulating layer 130.

In some embodiments, an optical element 150 is disposed on the insulating layer 130. In some embodiments, the optical element 150 may comprise a microlens array, a color filter, or a combination thereof or another suitable optical element. In some embodiments, the chip package may not include the optical element 150.

In some embodiments, a cover plate 170 is disposed on the first surface 100a of the substrate 100 so as to protect the optical element 150. In the embodiment, the cover plate 170 may comprise glass, quartz, transparent polymer or another suitable transparent material. In some embodiments, the chip package may not include the cover plate 170, so that the insulating layer 130 and the optical element 150 are exposed.

Moreover, a spacer layer (or referred to as dam) 160 is formed between the substrate 100 and the cover plate 170, covers the conductive pads 140, and exposes the optical element 150. In some embodiments, the spacer layer 160, the cover plate 170, and the insulating layer 130 together surround a cavity 180 on the sensing or device region 120 so that the optical element 150 is located in the cavity 180.

In one embodiment, the spacer layer 160 does not substantially absorb moisture. In some embodiments, the spacer layer 160 may be non-adhesive, and the cover plate 170 is attached on the substrate 100 through an additional adhesive layer. In some other embodiments, the spacer layer 160 may itself be adhesive. The cover plate 170 can attach to the substrate 100 by the spacer layer 160 so the spacer layer 160 may contact none of the adhesion glue, thereby assuring that the spacer layer 160 will not move due to the disposition of the adhesion glue. Furthermore, since the adhesion glue is not needed, the optical element 150 can be protected against contamination by an overflow of adhesion glue.

In the embodiment, the spacer layer 160 may comprise epoxy resin, inorganic materials (such as silicon oxide, silicon nitride, silicon oxynitride, metal oxide or a combination thereof), organic polymer materials (such as polyimide (polyimide), butylcyclobutene (BCB), parylene, polynaphthalenes, fluorocarbons, or acrylates), a photoresist material or another suitable insulating material.

In some other embodiments, the chip package may not include the spacer layer 160. In some embodiments, an adhesive layer (e.g., a tape) that covers the conductive pads 140 and the optical element 150 may be disposed between the substrate 100 and the cover plate 170.

In some embodiments, a recess 190 is formed in the substrate 100 and extends from the second surface 100b toward the first surface 100a. The recess 190 vertically overlaps the sensing or device region 120 and spaced apart from the sensing or device region 120 via a portion of the substrate 100 (e.g., the top portion). In some other embodiments, the substrate 100 may have a plurality of individual recesses 190.

In some embodiments, the recess 190 substantially and entirely overlaps the sensing or device region 120. In some other embodiments, the recess 190 may partially overlaps the sensing or device region 120. In some embodiments, the recess 190 has a sidewall that is tilted to the second surface 100b. In some other embodiments, the recess 190 has a sidewall that is substantially vertical to the second surface 100b.

In some embodiments, openings 200 pass through the substrate 100 and extend into the insulating layer 130, so as to expose the corresponding conductive pads 140 from the second surface 100b of the substrate 100. In some embodiments, the opening 200 has a sidewall that is tilted to the second surface 100b. In some other embodiments, the opening 200 has a sidewall that is substantially vertical to the second surface 100b.

Since the opening 200 passes through the substrate 100 and the recess 190 is spaced apart from the sensing or device region 120 via the top portion of the substrate 100, the depth $D_2$ of the opening 200 in the substrate 100 is greater than the depth $D_1$ of the recess 190 in the substrate 100, as shown in FIG. 1C. In some embodiments, the size of the recess 190 is greater than the size of the opening 200. For example, the capacity of the recess 190 id greater than the capacity of the opening 200, as shown in FIG. 2. In some embodiments, the openings 200 are arranged on both sides of the recess 190, as shown in FIG. 1G. In some embodiments, the openings 200 are arranged around the recess 190 to together surround the recess 190, as shown in FIG. 2. In FIG. 2, the top-view profile of the recess 190 is rectangular and the top-view profile of the openings 200 is circular. However, It should be realized that the top-view profiles of the recess 190 and the openings 200 may be another shape and the recess 190 and the opening 200 may have another arrangement, and they are not limited thereto.

In some embodiments, an insulating layer 210 is disposed on the second surface 100b of the substrate 100, conformally extends to the sidewall and bottom of the recess 190 and the sidewalls of the openings 200, and exposes the conducting pads 140. In some embodiments, the insulating layer 210 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

A patterned redistribution layer 220 is disposed on the second surface 100b of the substrate 100, and conformally extends to the sidewall and bottom of the recess 190 and the sidewalls and bottoms of the openings 200. The redistribution layer 220 may be electrically isolated from the substrate 100 by the insulating layer 210. The redistribution layer 220 may be in direct electrical contact with or indirectly electrically connected to the exposed conducting pads 140 through the openings 200. As a result, the redistribution layer 220 in the openings 200 is also referred to as a through silicon via (through silicon via, TSV). In some other embodiments, the redistribution layer 220 can also electrically connected to the corresponding conducting pads 140 by using other suitable methods. In some embodiments, the redistribution layer 220 may comprise aluminum, copper, gold, platinum, nickel, tin, a combination thereof, a conductive polymer material, a conductive ceramic material (e.g., indium tin oxide or indium zinc oxide), or other suitable conductive materials.

In some embodiments, a protection layer 230 is disposed on the second surface 100b of the substrate 100, and fills the recess 190 and the openings 200 to cover the redistribution layer 220. The protection layer 230 merely extends along the sidewall of the recess 190 onto the bottom of the recess 190 and covers the redistribution layer 220 on the bottom of the recess 190 without fully filling the recess 190, so that a suitable capacity is remained in the recess 190.

In some embodiments, the protection layer 230 covers the top portion of the openings 200 without fully filling the openings 200, so that a hole is formed between the redistribution layer 220 and the protection layer 230 within the openings 200. In some other embodiments, the openings 200 are fully filled with the protection layer 230. In some embodiments, the protection layer 230 is in direct electrical contact with the redistribution layer 220 on the bottom of the recess 190, while the protection layer 230 is spaced apart from the redistribution layer 220 on the bottom of the openings 200.

In one embodiment, the protection layer 230 may comprise epoxy resin, solder mask (solder mask), inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

The protection layer 230 on the bottom of the recess 190 has first openings 240 which partially expose the redistribution layer 220 on the bottom of the recess 190. The protection layer 230 on the second surface 100b of the substrate 100 has second openings 250 which partially expose the redistribution layer 220 on the second surface 100b. In some embodiments, the width of the first openings 240 may be equal to or greater than the width of the second openings 250.

In some embodiments, first conductive structures 260 (such as solder balls, bumps or conductive pillars) are disposed in the first openings 250 of the protection layer 230 to electrically connect to the exposed redistribution layer 220. In some embodiments, the first conductive structures 260 may comprise tin, lead, copper, gold, nickel, another suitable conductive material, or a combination thereof.

Second conductive structures 290 (such as solder balls, bumps or conductive pillars) are disposed in the second openings 250 of the protection layer 230 to electrically connect to the exposed redistribution layer 220. In some embodiments, the second conductive structures 290 may comprise tin, lead, copper, gold, nickel, another suitable conductive material, or a combination thereof.

The second conductive structures 290 is disposed on the second surface 100b and the first conductive structures 260 is disposed in the recess 190, so that the second conductive structures 290 and the first conductive structures 260 are disposed at different levels. In some embodiments, the second conductive structures 290 are disposed on both sides of the first conductive structures 260. In some other embodiments, the second conductive structures 290 are disposed around the first conductive structures 260 to surround the first conductive structures 260. The second conductive structures 290 and the first conductive structures 260 may be formed of the same material or different materials. In some embodiments, the size of the second conductive structures 290 is greater than the size of the first conductive structures 260. In some other embodiments, the size of the second conductive structures 290 may be equal to or less than the size of the first conductive structures 260.

In some embodiments, an electronic device 270 is mounted onto the substrate 100 via the first conductive structures 260 in the recess 190 and is electrically connected to the sensing or device region 120. In some embodiments, the electronic device 270 is an active device or a passive device. For example, the active device may include a chip including transistors or diodes or another suitable integrated circuit chip. The passive device may include a resistor, a capacitor, an inductor, an integrated passive device (IPD), or another suitable passive device.

Moreover, an underfill layer 280 is filled between the bottom of the recess 190 and the electronic device 270. The underfill layer 280 is interposed between the protection layer 230 and the electronic device 270 and the underfill layer 280 surrounds the first conductive structures 260 to protective the first conductive structures 260. In some embodiments, the underfill layer 280 substantially and fully fills the recess 190 and the underfill layer 280 surrounds the electronic device 270 or further covers the electronic device 270. In some embodiments, the underfill layer 280 may be formed of a thermosetting material with high diffusivity and high flowability. In some embodiments, the underfill layer 280 may comprise resin or another suitable material.

In some embodiments, the size of the electronic device 270 is less than that of the substrate 100 and the electronic device is embedded in the substrate 100 via the recess 190, so that the electronic device 270 is surrounded by a portion (e.g., the bottom portion) of the substrate 100. The electronic device 270 vertically overlaps the sensing or device region 120, the optical element 150 and the cover plate 170 and is not laterally arranged with the substrate 100.

In some embodiments, the electronic device 270 protrudes from the top portion of the recess 190 and does not protrude from the chip package. For example, a surface of the electronic device 270 is substantially coplanar with a surface of the protection layer 230 on the second surface 100b. In some embodiments, the electronic device 270 may protrude from the protection layer 230 on the second surface 100b and does not protrude from the top surface of the second conductive structures 290. In some other embodiments, the electronic device 270 is entirely disposed within the recess 190 and does not protrude from the recess 190. In some embodiments, the openings 200 are arranged on both sides of the electronic device 270, as shown in FIG. 1G. In some embodiments, the openings 200 are arranged around the electronic device 270 and together surround the electronic device 270, as shown in FIG. 2.

In some embodiments, the recess 190 has a sufficient size or the electronic device 270 is small enough to dispose one or more electronic devices 270 with the same functionality or different functionalities in the recess 190. Moreover, the electronic device 270 may include one or more active devices, one or more passive devices, or combinations thereof. In some embodiments, the electronic device 270 corresponds to the central of the substrate 100 and entirely or partially overlaps the sensing or device region 120. In some other embodiments, the electronic device 270 may not overlap the sensing or device region 120.

Figure 3:
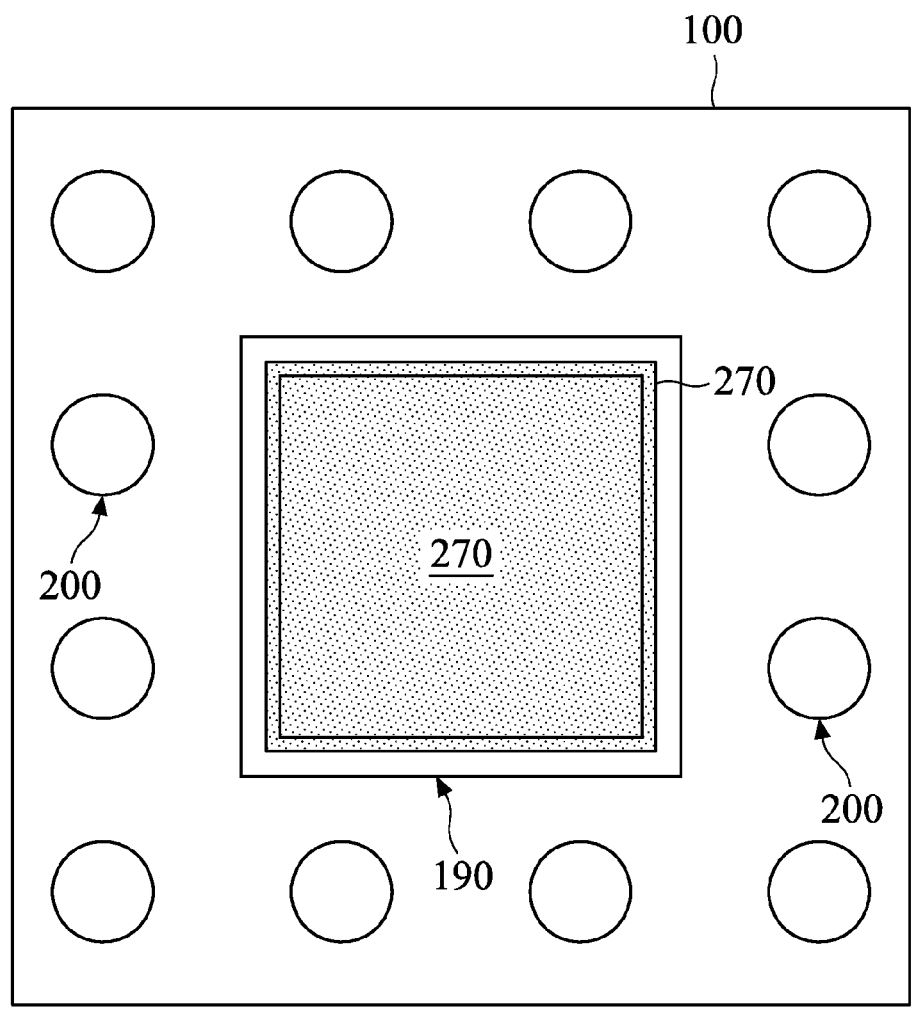
Figure 4:
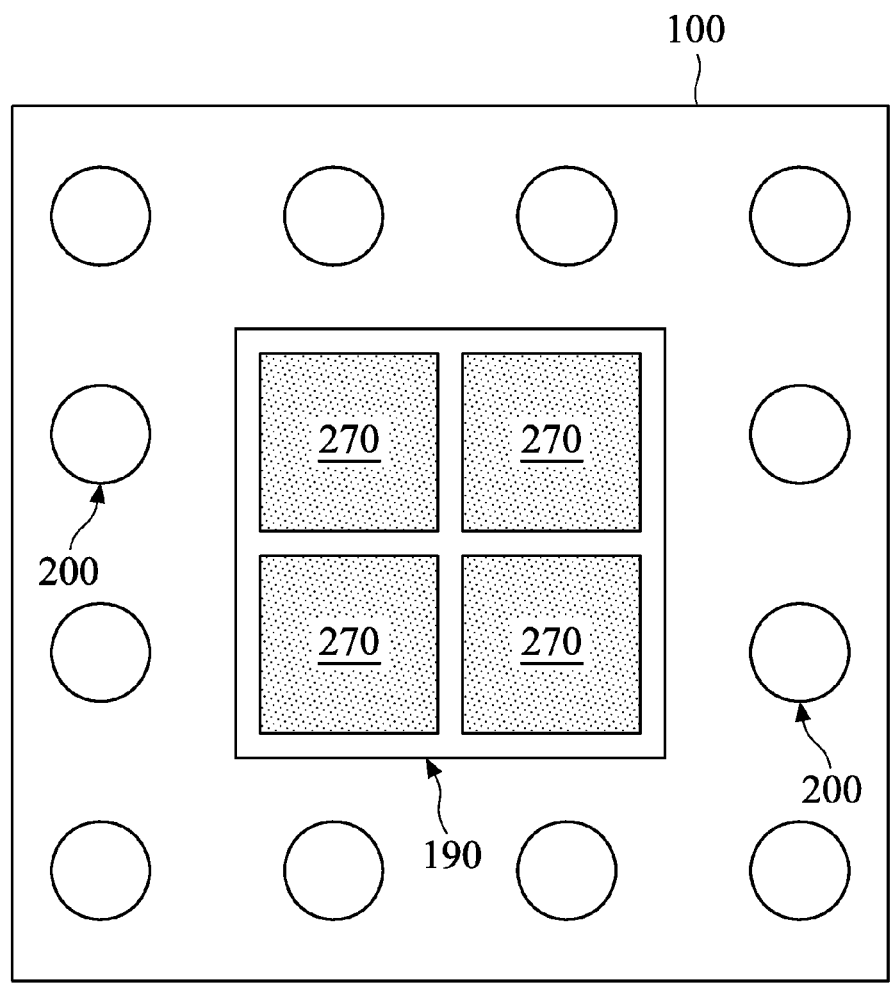

For example, electronic devices 270 may be vertically stacked and electrically connected to each other in the single recess 190, as shown in FIG. 3. The vertically stacked electronic devices 270 may have the same size or different sizes. In some embodiments, electronic devices 270 may be laterally arranged and electrically connected to each other in the single recess 190, as shown in FIG. 4. The laterally arranged electronic devices 270 may have the same size or different sizes.

Figure 5:
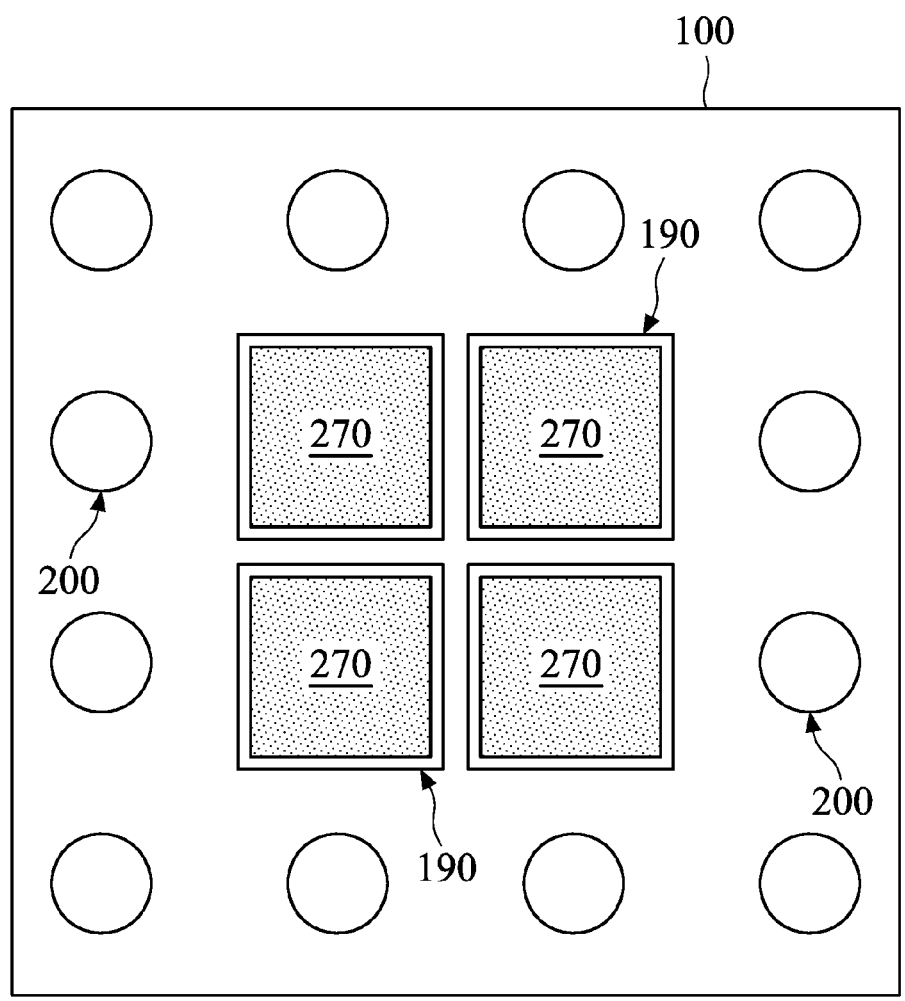

In some other embodiments, the substrate may include individual recesses 190 therein and the recesses 190 may have the same size or different sizes and have the same top-view profile or different top-view profiles, as shown in FIG. 5. A single electronic device 270, vertically stacked electronic devices 270, or laterally arranged electronic devices 270 may be disposed in each recess 190. It should be understood that the number of the recesses 190 or the electronic devices 170 and the arrangement of the recesses 190 or the electronic devices 170 are based on the design demands and they are not limited thereto.

In some embodiments, the substrate 100 having the electronic device 270 embedded therein may be optionally mounted onto a circuit board or directly mounted onto a motherboard, so that the electronic device 270 is vertically located between the sensing or device region 120 and the circuit board or the motherboard, and is surrounded by the substrate 100 and the circuit board or the motherboard. The sensing or device region 120 is electrically connected to the circuit board or the motherboard via the second conductive structures 290 and the electronic device 270 is electrically connected to the circuit board or the motherboard via the first conductive structures 270 and the second conductive structures 290.

According to the aforementioned embodiments of the invention, one or more electronic devices can be integrated in the chip package without increasing the size of the chip package. As a result, the circuit board that is mounted to the chip package does not need to retain a space for disposition of the electronic device, thereby reducing the size of the chip module. Moreover, the chip package integrated with electronic device can be also directly mounted to the motherboard, thereby greatly reducing the size of the electronic products.

In the embodiments mentioned above, the chip package comprises a front side illumination (FSI) sensor device. However, in other embodiments, the chip package may comprise a back side illumination (BSI) sensor device. Additionally, although the optical sensing device is used as an example in the embodiments mentioned above, the invention is not limited thereto and one or more electronic devices may be integrated in any suitable types of the chip package by the invention.

An exemplary embodiment of a method for forming a chip package according to the invention is illustrated in FIGS. 1A to 1G. FIGS. 1A to 1G are cross-sectional views of an exemplary embodiment of a method for forming a chip package according to the invention. Moreover, structures and materials of the chip package which are the same as those mentioned previously are not described again.

Referring to FIG. 1A, a substrate 100 is provided. The substrate 100 has a first surface 100a and a second surface 100b opposite thereto. In some embodiments, the substrate 100 may be a silicon wafer or another semiconductor wafer so as to facilitate the wafer-level packaging process. The substrate 100 may comprise chip regions 110 and scribe lines for separating the chip regions 110. To simplify the diagram, only a complete chip region 110 is depicted herein.

An insulating layer 130 is formed on the first surface 100a of the substrate 100. One or more conductive pads 140 are in the insulating layer 130 in each of the chip regions 110. The insulating layer 130 in each of the chip regions 110 comprises one or more openings exposing the corresponding conductive pads 140. Each of the chip regions 110 includes a sensing or device region 120 therein. The sensing or device region 120 is adjacent to the first surface 100a and disposed in the substrate 100 and/or the insulating layer 130. In some embodiments, the sensing device in the sensing or device region 120 may be electrically connected to the conductive pads 140 through interconnection structures (not shown) in the substrate 100 and/or the insulating layer 130.

In some embodiments, the aforementioned structure may be fabricated by sequentially performing a front-end (front end) process (for example, the sensing or device region 120 is formed in the substrate 100) and a back-end (back end) process (for example, the insulating layer 130, the interconnection structures, and the conductive pads 140 are formed on the substrate 100) of a semiconductor device. In other words, the following method for forming a chip package includes subsequent packaging processes performed on the substrate after the back-end process is finished.

In some embodiments, each of the chip regions 110 comprises an optical element 150 disposed on the first surface 100a of the substrate 100 and corresponding to the sensing or device region 120. Afterward, a cover plate 170 is bonded onto the first surface 100a of the substrate 100 by a spacer layer 160. The spacer layer 160 forms a cavity 180 between the substrate 100 and the cover plate 170 in each of the chip regions 110, so that the optical element 150 is located in the cavity 180 and the optical element 150 in the cavity 180 is protected by the cover plate 170.

In some embodiments, the spacer layer 160 may be formed on the cover plate 170, and then bond the cover plate 170 to the substrate 100. In some other embodiments, the spacer layer 160 may be formed on the substrate 100, and then bond the cover plate 170 to the substrate 100. In some embodiments, the spacer layer 160 can be formed by a deposition process (such as a coating process, a physical vapor deposition process, a chemical vapor deposition process or another suitable process). In some embodiments, the spacer layer 160 may comprise a photoresist material, and may be patterned by exposure and developing processes to form the cavity 180 in the subsequent processes. In other embodiments, the spacer layer 160 can be replaced by an adhesive layer (e.g., a tape), so as to bond the cover plate 170 to the first surface 100a of the substrate 100. The adhesive layer covers the conductive pads 140 and the optical element 150.

Referring to FIG. 1B, a thinning process (such as an etching process, a milling process, a grinding process or a polishing process) is performed on the second surface 100b of the substrate 100 by using the cover plate 170 as a carrier substrate, to reduce the thickness of the substrate 100.

Afterwards, one or more recesses 190 and openings 200 may be formed in the substrate 100 in each of the chip regions 110 by a lithography process and an etching process (such as a dry etching process, a wet etching process, a plasma etching process, a reactive ion etching process, or another suitable process). The recess 190 corresponds to the sensing or device region 120, extends from the second surface 100b toward the first surface 100a, and is separated from the sensing or device region 120 by a top portion of the substrate 100. The openings 200 correspond to the conductive pads 140, extend from the second surface 100b toward the first surface 100a, and are separated from the insulating layer 130 by the top portion of the substrate 100. In some embodiments, the recess 190 and the openings 200 are simultaneously formed in the same process, so that the recess 190 and the openings 200 have substantially the same depth. In some other embodiments, the recess 190 and the openings 200 may be formed in different steps.

Referring to FIG. 1C, the openings 200 penetrate the substrate 100 by performing a lithography process and an etching process (such as a dry etching process, a wet etching process, a plasma etching process, a reactive ion etching process, or another suitable process), so that the insulating layer 130 is exposed from the second surface 100b of the substrate 100. As a result, the depth $D_2$ of the openings 200 in the substrate 100 is greater than the depth $D_1$ of the recess 900 in the substrate 100. Since the openings 200 exposing the insulating layer 130 are formed by a two-step etching process, the problems caused by high aspect ratio can be prevented and the process difficulty for formation of the openings 200 can be reduced.

In some embodiments, openings (not shown) are formed in the substrate 100 between adjacent chip regions 110 (i.e., the scribe line) through first-step lithography and etching processes, in which those openings extend along the scribe line. Afterward, those openings penetrate the substrate 100 through second-step lithography and etching processes, so as to separate the substrate 100 in each of the chip regions 110. Moreover, after the second-step lithography and etching processes are performed, the substrate 100 in each of the chip regions 110 has a sidewall portion adjacent to the openings 200. Such a sidewall portion has a thickness that is less than that of the substrate 100 and has a flat surface that is opposite to the first surface 100a.

Referring to FIG. 1D, an insulating layer 210 is formed on the second surface 100b of the substrate 100 by a deposition process (such as a coating process, a physical vapor deposition process, a chemical vapor deposition process or another suitable process). The insulating layer 210 is conformally deposited on the sidewalls and the bottoms of the recess 190 and the openings 200.

Next, the insulating layer 210 on the bottom of the openings 200 and the underlying insulating layer 130 are removed by lithography and etching processes, suchh that the openings 200 extend into the insulating layer 130 and expose the corresponding conducting pads 140. Next, a patterned redistribution layer 220 is formed on the insulating layer 210 by a deposition process (such as a coating process, a physical vapor deposition process, a chemical vapor deposition process, an electroplating process, an electroless plating process or another suitable process) and lithography and etching processes. The redistribution layer 220 conformally extends to the sidewalls and the bottoms of the recess 190 and the openings 200.

Referring to FIG. 1E, a protection layer 230 may be formed on the second surface 100b of the substrate 100 by a deposition process. The protection layer 230 fills the recess 190 and the openings 200 to cover the redistribution layer 220. The protection layer 230 conformally extends to the bottom of the recess 190 along the sidewall of the recess 190 and does not fully fill the recess 190, so that the recess 190 retains a sufficient capacity therein.

In some embodiments, the protection layer 230 covers the top portion of the openings 200 and does not fully fill the openings 200, so that a hole is formed between the redistribution layer 220 and the protection layer 230 within the openings 200. Therefore, the redistribution layer 220 and the protection layer 230 within the openings 200 are separated from each other. As a result, the hole can be a buffer between the redistribution layer 220 and the protection layer 230 in thermal cycles (thermal cycle) induced in subsequent processes. Undesirable stress, which is induced between the redistribution layer 220 and the protection layer 230 as a result of a mismatch of thermal expansion coefficients, is reduced. The redistribution layer 220 is prevented from being excessively pulled by the protection layer 230 when the external temperature or pressure dramatically changes. As a result, problems such as peeling or disconnection of the redistribution layer 220, which is close to the conductive pad structure, are avoidable. In some other embodiments, the protection layer 230 may fully fill the openings 200.

Afterward, first openings 240 may be formed in the protection layer 230 on the bottom of the recess 190 and second openings 250 may be formed in the protection layer 230 on the second surface 100b of the substrate 100 by lithography and etching processes so as to expose portions of the redistribution layer 220.

Referring to FIG. 1F, first conductive structures 260 (such as solder balls, bumps or conductive pillars) may be filled in the first openings 240 of the protection layer 230 by a ball placement process, an electroplating process, a screen printing process or another suitable process to electrically connect to the exposed redistribution layer 220. At this time, the redistribution layer 220 on the second surface 100b is still exposed from the second openings 250.

Afterward, a reflow process or another suitable process may be performed, so that one or more electronic devices 270 is flip-bonded to the substrate 100 via the first conductive structures 260 and embedded in the recess 190. In some embodiments, the distance A between the electronic device 270 and the sensing or device region 120 is less than the distance B between the second surface 100b of the substrate 100 and the sensing or device region 120.

Referring to FIG. 1G, an underfill layer 280 is filled between the bottom of the recess 190 and the electronic device 270 by a dispensing process, a molding process, or another suitable process. In some embodiments, the underfill layer 280 substantially and fully fills the recess 190.

Afterward, second conductive structures 290 (such as solder balls, bumps or conductive pillars) may be filled in the second openings 250 of the protection layer 230 by a screen printing process, a ball placement process, an electroplating process, or another suitable process to electrically connect to the exposed redistribution layer 220. In some embodiments, the formation method of the second conductive structures 290 is the same as that of the first conductive structures 260. In some other embodiments, the formation method of the second conductive structures 290 is different from that of the first conductive structures 260.

In some embodiments, since the second conductive structures 290 is formed after bonding of the electronic device 270 and formation of the underfill layer 280, the residue contamination in the recess 190 can be avoidable. In some other embodiments, the first conductive structure 260 and the second conductive structures 290 are formed prior to bonding of the electronic device 270 and formation of the underfill layer 280. Moreover, the order of forming the first conductive structure 260 and the second conductive structures 290 is not limited.

Thereafter, a dicing process is performed along the scribed lines (not shown) between the adjacent chip regions 110 so as to form individual chip packages. For example, a dicing saw or laser may be used to perform the dicing process. The formed chip package may comprise one or more electronic devices embedded in the substrate/chip and can be optionally mounted to the circuit board or directly mounted to a motherboard.

According to the chip package of the invention, active devices and/or passive devices can be integrated with the chip without increasing the size of the chip package. As a result, the chip package may have multiple functionalities and can be referred to as a chip module (e.g., a multi-chip module). In other words, the method for forming the chip package can be integrated with the chip module process that is used in the fabrication of electronic products, thereby simplifying the fabrication of electronic products and greatly reducing the size of the electronic products.

Figure 6:
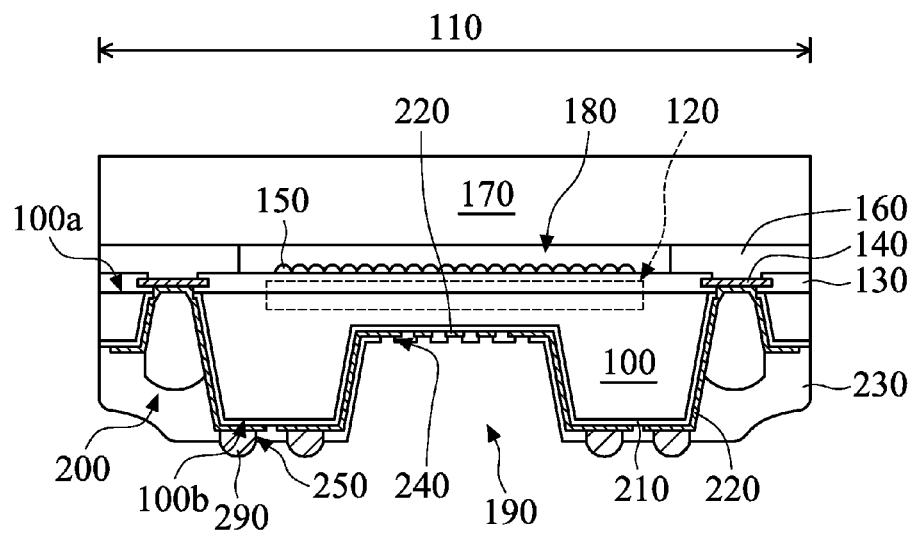
FIGS. 6 to 7 are cross-sectional views of some other exemplary embodiments of a chip package according to the invention.
Figure 7:
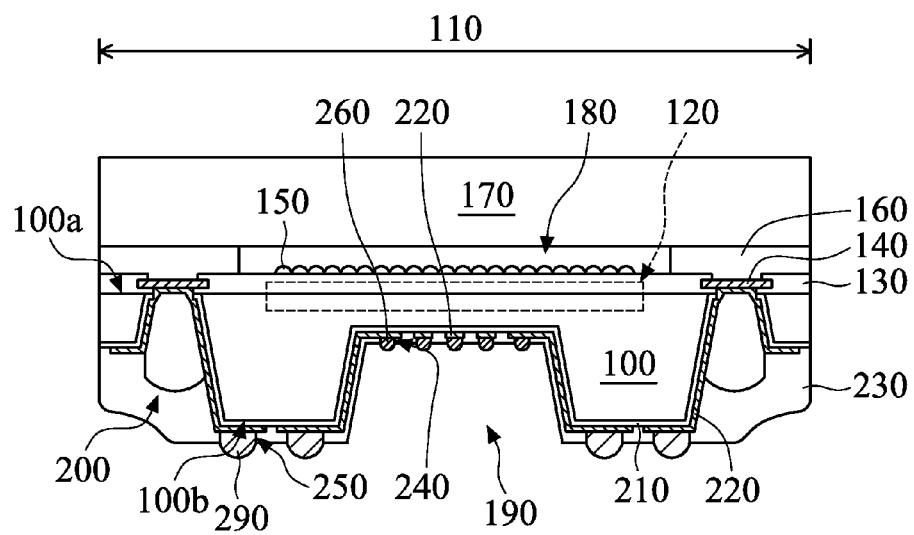

Some other exemplary embodiments of a method for forming a chip package according to the invention are illustrated in FIGS. 6 to 7. FIGS. 6 to 7 are cross-sectional views of some other exemplary embodiments of a method for forming a chip package according to the invention. Elements in FIGS. 6 to 7 that are the same as those in FIGS. 1A to 1G are labeled with the same reference numbers as in FIGS. 1A to 1G and are not described again for brevity.

Referring to FIG. 6, a structure shown in FIG. 1E is provided by the steps that are the same as or similar to those used in FIGS. 1A to 1E. Afterward, second conductive structures 290 may be filled in the second openings 250 of the protection layer 230 by a screen printing process, a ball placement process, an electroplating process, or another suitable process. In some embodiments, the redistribution layer 220 in the recess 190 is exposed from the first openings 240 after the formation of the second conductive structures 290.

Afterward, a dicing process is performed along the scribe lines (not shown) between the adjacent chip regions 110 so as to form individual chip packages. These chip packages have the redistribution layer 220 exposed from the first openings 240 and the recess 190 has a sufficient capacity for receiving various electronic devices. Thereafter, one or more electronic devices may optionally be flip-bonded to the recess 190 of the substrate 100 via suitable conductive structures 260, so that the electronic devices are embedded in the individual chip package. As a result, there is increased flexibility in the design of various chip packages and various electronic devices.

Referring to FIG. 7, a structure shown in FIG. 1E is provided by the steps that are the same as or similar to those used in FIGS. 1A to 1E. Afterward, first conductive structures 260 may be filled in the first openings 240 of the protection layer 230 and second conductive structures 290 may be filled in the second openings 250 of the protection layer 230 by a screen printing process, a ball placement process, an electroplating process, or another suitable process. In some embodiments, the first conductive structures 260 are formed prior to the formation of the second conductive structures 290. In some embodiments, the second conductive structures 290 are formed prior to the formation of the first conductive structures 260. In some other embodiments, the first conductive structures 260 and the second conductive structures 290 are formed simultaneously.

Afterward, a dicing process is performed along the scribe lines (not shown) between the adjacent chip regions 110 so as to form individual chip packages. These chip packages have first conductive structures 260 exposed from the recess 190 and the recess 190 has a sufficient capacity for receiving various electronic devices. Thereafter, one or more electronic devices may be optionally flip-bonded to the recess 190 of the substrate 100 via suitable conductive structures 260, so that the electronic devices are embedded in the individual chip package. As a result, there is more flexibility in the design of various chip packages and various electronic devices, and the quality and reliability of the electronic product can be assured.

It should be understood that although the embodiments shown in FIGS. 1A to 1G and 6 to 7 are methods for forming a chip package with front side illumination sensor devices, methods for forming a recess for receiving various electronic devices may be used in the fabrication of back side illumination sensor devices or the fabrication of other chip package types.

According to the aforementioned embodiments of the invention, a region of the substrate/chip without including any circuits or component is used for recess formation. Such a recess provides an interior capacity for receiving various electronic devices. Therefore, multi-chip packages with three dimensions (3D) can be accomplished, so as to form chip modules or electronic products with extremely small in size.

While the invention has been disclosed in terms of the preferred embodiments, it is not limited. The various embodiments may be modified and combined by those skilled in the art without departing from the concept and scope of the invention.

What is claimed is:

1. A chip package, comprising:
   a substrate having a first surface and a second surface opposite thereto, wherein the substrate comprises a sensing or device region which is adjacent to the first surface;
   a recess in the substrate, wherein the recess extends from the second surface towards the first surface, and is under the sensing or device region;
   a redistribution layer extending from the second surface into the recess; and
   a protection layer extending from the second surface of the substrate into the recess to cover the redistribution layer on a bottom of the substrate and expose a top portion of the recess.

2. The chip package as claimed in claim 1, further comprising one or more electronic devices in the recess, wherein the one or more electronic devices are under the sensing or device region and are electrically connected to the redistribution layer in the recess.

3. The chip package as claimed in claim 2, wherein the one or more electronic devices comprise active devices, passive devices, or combinations thereof.

4. The chip package as claimed in claim 2, wherein the one or more electronic devices are embedded in the substrate via the recess, so that the one or more electronic devices are surrounded by a portion of the substrate.

5. The chip package as claimed in claim 2, further comprising an underfill layer that is filled between the one or more electronic devices and a bottom of the recess.

6. The chip package as claimed in claim 2, wherein the one or more electronic devices are laterally arranged in the recess or vertically stacked in the recess.

7. The chip package as claimed in claim 1, further comprising another recess formed in the substrate, extending from the second surface toward the first surface, and being under the sensing or device region.

8. The chip package as claimed in claim 7, further comprising one or more electronic devices embedded in the substrate via the recess and the another recess, so that the one or more electronic devices are surrounded by a portion of the substrate.

9. The chip package as claimed in claim 1, wherein the protection layer comprises:
a first opening partially exposes the redistribution layer in the recess; and
a second opening partially exposes the redistribution layer on the second surface.

10. The chip package as claimed in claim 9, further comprising:
a first conductive structure in the first opening and electrically connected to the redistribution layer, wherein the first conductive structure is under the sensing or device region; and
a second conductive structure in the second opening and electrically connected to the redistribution layer.

11. The chip package as claimed in claim 9, further comprising a second conductive structure in the second opening and electrically connected to the redistribution layer, wherein the redistribution layer in the recess is exposed from the first opening.

12. The chip package as claimed in claim 1, further comprising:
a conductive pad adjacent to the first surface of the substrate and outside of the sensing or device region; and
an opening in the substrate, wherein the opening extends from the second surface toward the first opening to expose the conductive pad, and wherein the redistribution layer extends from the second surface into the recess so as to be electrically connected to the conductive pad.

13. The chip package as claimed in claim 12, wherein the recess has a depth that is less than that of the opening and has a size that is greater than that of the opening.

14. The chip package as claimed in claim 12, wherein the protection layer extends from the second surface of the substrate into the opening, and wherein the protection layer is separated from the redistribution layer on a bottom of the opening and contacts the redistribution layer on a bottom of the recess.

15. A method for forming a chip package, comprising:
providing a substrate having a first surface and a second surface opposite thereto, wherein the substrate comprises a sensing or device region which is adjacent to the first surface;
forming a recess in the substrate, wherein the recess extends from the second surface towards the first surface, and is under the sensing or device region;
forming a redistribution layer extending from the second surface into the recess; and
forming a protection layer on the second surface of the substrate after the formation of the redistribution layer, wherein the protection layer extends into the recess to cover the redistribution layer on a bottom of the recess while exposing a top portion of the recess.

16. The method for forming a chip package as claimed in claim 15, further comprising forming an opening in the substrate during the formation of the recess, wherein the opening extends from the second surface toward the first opening.

17. The method for forming a chip package as claimed in claim 16, wherein a conductive pad adjacent to the first surface of the substrate and outside of the sensing or device region, and wherein the method for forming a chip package further comprises extending the opening after the formation of the recess and before the formation of the redistribution layer until the conductive pad is exposed, so that the opening has a depth that is greater than that of the recess.

18. The method for forming a chip package as claimed in claim 1, further comprising:
forming a first opening in the protection layer to partially expose the redistribution layer in the recess; and
forming a second opening in the protection layer to partially expose the redistribution layer on the second surface.

19. The method for forming a chip package as claimed in claim 18, further comprising:
forming a first conductive structure in the first opening, wherein the first conductive structure is electrically connected to the redistribution layer and is under the sensing or device region; and
forming a second conductive structure in the second opening, wherein the second conductive structure is electrically connected to the redistribution layer and the recess exposes the first conductive structure after the formation of the first conductive structure and the second conductive structure.

20. The method for forming a chip package as claimed in claim 18, further comprising forming a second conductive structure in the second opening, wherein after the formation of the second conductive structure, the first opening exposes the redistribution layer in the recess.

21. The method for forming a chip package as claimed in claim 18, further comprising:
forming a first conductive structure in the first opening, so that an electronic device is bonded on the substrate via the first conductive structure, wherein the electronic device is embedded in the substrate via the recess, so that the electronic device is surrounded by a portion of the substrate; and
forming a second conductive structure in the second opening after the bonding of the electronic device, wherein the second conductive structure is electrically connected to the redistribution layer.

22. The method for forming a chip package as claimed in claim 21, further comprising filling an underfill layer between the electronic device and the bottom of the substrate prior to the formation of the second conductive structure.

23. The method for forming a chip package as claimed in claim 21, further comprising performing a dicing process after the bonding of the electronic device and the formation of the second conductive structure.

* * * * *